(12) United States Patent
Kawadu

(10) Patent No.: US 11,872,898 B2
(45) Date of Patent: Jan. 16, 2024

(54) ABNORMALITY DIAGNOSIS SYSTEM AND ABNORMALITY DIAGNOSIS METHOD

(71) Applicant: DENSO CORPORATION, Kariya (JP)

(72) Inventor: Shinsuke Kawadu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/889,842

(22) Filed: Aug. 17, 2022

(65) Prior Publication Data

US 2022/0388400 A1 Dec. 8, 2022

Related U.S. Application Data

(63) Continuation of application No. PCT/JP2021/005471, filed on Feb. 15, 2021.

(30) Foreign Application Priority Data

Feb. 18, 2020 (JP) .................................. 2020-025007

(51) Int. Cl.
*G06F 17/00* (2019.01)
*B60L 3/00* (2019.01)
(Continued)

(52) U.S. Cl.
CPC .............. *B60L 3/0061* (2013.01); *B60L 15/20* (2013.01); *B60L 53/20* (2019.02); *B64D 35/04* (2013.01);
(Continued)

(58) Field of Classification Search
CPC ........ B60L 3/0061; B60L 15/20; B60L 53/20; B60L 2200/10; B60L 2240/425;
(Continued)

(56) References Cited

U.S. PATENT DOCUMENTS

| 5,796,221 A | 8/1998 | Cramer et al. |
| 8,543,280 B2 * | 9/2013 | Ghimire ................. G07C 5/008 |
| | | 714/25 |

(Continued)

FOREIGN PATENT DOCUMENTS

| JP | H05-184002 A | 7/1993 |
| JP | 2005-049178 A | 2/2005 |

(Continued)

OTHER PUBLICATIONS

Fault Classification and Diagnosis of UAV motor (Year: 2021).*

*Primary Examiner* — Ronnie M Mancho
(74) *Attorney, Agent, or Firm* — Oliff PLC

(57) ABSTRACT

An abnormality diagnosis system performs an abnormality diagnosis of a plurality of motor systems that include a motor for moving a moving body. The abnormality diagnosis system identifies a comparison target system that is the motor system, among the motor systems, that is a comparison target in relation to a diagnosis target system that is the motor system to be a target of the abnormality diagnosis. The abnormality diagnosis system acquires a state-related value that is a value related to an operation state of the motor from each of the diagnosis target system and the comparison target system. The abnormality diagnosis system performs a comparison of the state-related value that is acquired from the diagnosis target system and the state-related value that is acquired from the comparison target system, and diagnoses a presence or absence of an abnormality in the diagnosis target system using a result of the comparison.

20 Claims, 11 Drawing Sheets

(51) Int. Cl.
  *B60L 53/20* (2019.01)
  *B60L 15/20* (2006.01)
  *B64D 35/04* (2006.01)
  *G01R 31/34* (2020.01)
  *G05D 17/02* (2006.01)
  *B64C 29/00* (2006.01)

(52) U.S. Cl.
  CPC ............ *G01R 31/34* (2013.01); *G05D 17/02* (2013.01); *B60L 2200/10* (2013.01); *B60L 2240/425* (2013.01); *B60L 2240/527* (2013.01); *B64C 29/0008* (2013.01)

(58) Field of Classification Search
  CPC .......... B60L 2240/527; B60L 2220/42; B64D 35/04; B64D 27/24; B64D 2045/0085; G01R 31/34; G01R 31/343; G01R 31/42; G05D 17/02; B64C 29/0008; G05B 23/0237; G07C 5/0808
  USPC ........................................................ 701/3
  See application file for complete search history.

(56) References Cited

U.S. PATENT DOCUMENTS

| | | | |
|---|---|---|---|
| 9,866,542 B2 * | 1/2018 | Baltes | H04L 63/1408 |
| 9,905,249 B1 | 2/2018 | Salonidis et al. | |
| 10,351,238 B2 * | 7/2019 | McAdoo | H02J 7/14 |
| 10,516,768 B2 * | 12/2019 | O'Mahony | H04L 1/0002 |
| 10,928,275 B1 * | 2/2021 | Dadam | G07C 5/02 |
| 11,361,600 B2 * | 6/2022 | Ross | H04L 63/123 |
| 11,427,090 B2 * | 8/2022 | Sinusas | H02P 5/74 |
| 2002/0161495 A1 * | 10/2002 | Yamaki | G07C 5/008 |
| | | | 701/33.8 |
| 2003/0216889 A1 * | 11/2003 | Marko | G07C 5/008 |
| | | | 702/182 |
| 2008/0243313 A1 | 10/2008 | Schaeffer | |
| 2008/0262663 A1 | 10/2008 | Ausloos et al. | |
| 2009/0043441 A1 * | 2/2009 | Breed | G07C 5/085 |
| | | | 701/31.9 |
| 2009/0157248 A1 * | 6/2009 | Gilbert | G01M 17/00 |
| | | | 701/33.8 |
| 2009/0240465 A1 | 9/2009 | Chervenka et al. | |
| 2012/0277949 A1 * | 11/2012 | Ghimire | G07C 5/008 |
| | | | 701/31.7 |
| 2016/0160781 A1 * | 6/2016 | Nagar | F02D 41/0007 |
| | | | 701/102 |
| 2016/0290114 A1 * | 10/2016 | Oehring | E21B 43/2607 |
| 2016/0308743 A1 * | 10/2016 | Alam | H04L 43/10 |
| 2017/0057630 A1 | 3/2017 | Schwaiger | |
| 2017/0069146 A1 * | 3/2017 | Sun | G07C 5/0808 |
| 2017/0190435 A1 | 7/2017 | Kobayashi et al. | |
| 2019/0188928 A1 * | 6/2019 | Mannan | G07C 5/0808 |
| 2019/0263520 A1 | 8/2019 | Todokoro | |
| 2019/0312892 A1 * | 10/2019 | Chung | G06F 21/554 |
| 2020/0055410 A1 * | 2/2020 | Sinusas | B60L 15/20 |
| 2020/0317058 A1 | 10/2020 | Tetsuo et al. | |
| 2021/0016786 A1 * | 1/2021 | Griffiths | B60W 50/14 |
| 2023/0006598 A1 * | 1/2023 | Kawadu | H02P 5/74 |

FOREIGN PATENT DOCUMENTS

| | | |
|---|---|---|
| JP | 2006-094574 A | 4/2006 |
| JP | 2006-222031 A | 8/2006 |
| JP | 2009-078745 A | 4/2009 |
| JP | 2009-270492 A | 11/2009 |
| WO | 2019/207457 A1 | 10/2019 |
| WO | WO-2022009638 A1 * | 1/2022 ........... B64C 27/006 |

* cited by examiner

FOURTH EMBODIMENT

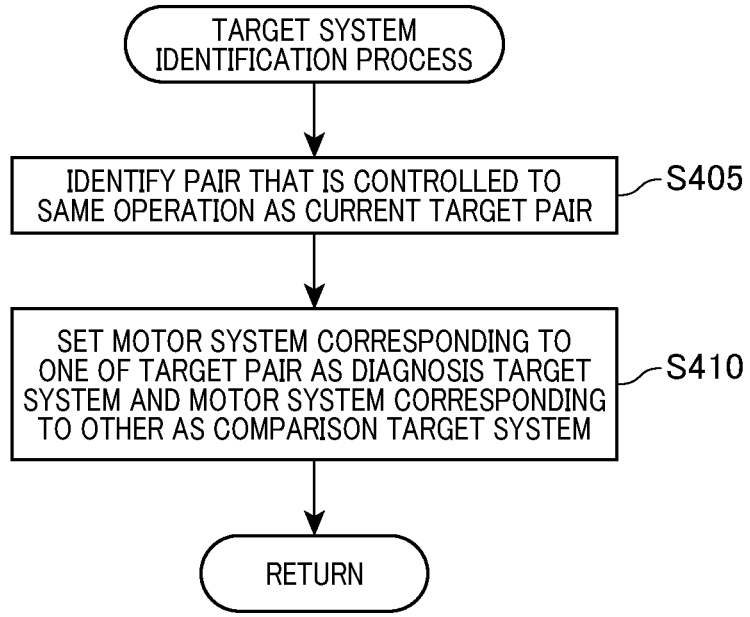

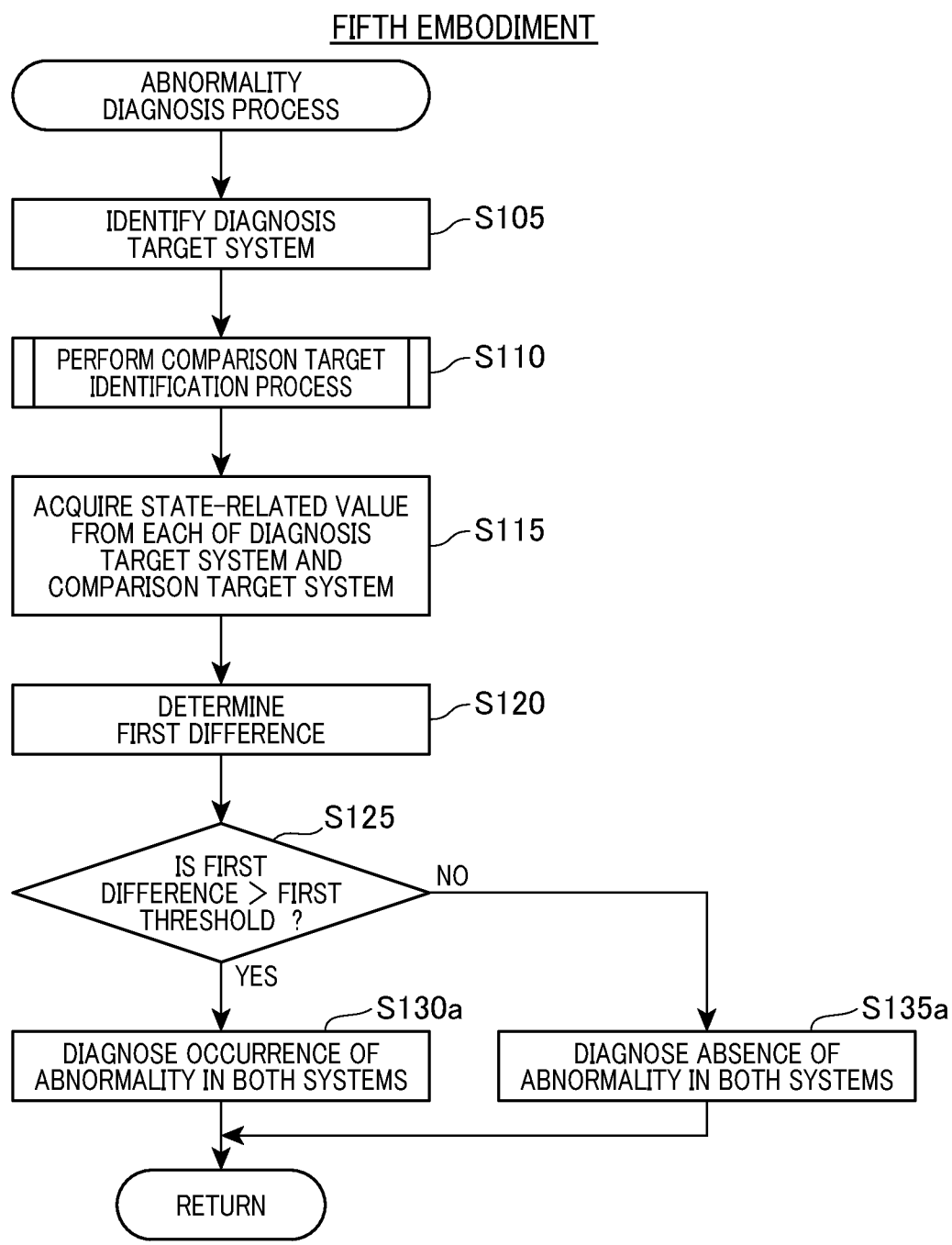

ABNORMALITY DIAGNOSIS SYSTEM AND ABNORMALITY DIAGNOSIS METHOD

CROSS-REFERENCE TO RELATED APPLICATION

The present application is a continuation application of International Application No. PCT/JP2021/005471, filed on Feb. 15, 2021, which claims priority to Japanese Patent Application No. 2020-025007, filed on Feb. 18, 2020. The contents of these applications are incorporated herein by reference in their entirety.

BACKGROUND

Technical Field

The present disclosure relates to an abnormality diagnosis for a plurality of motor systems.

Related Art

In recent years, in accompaniment with the electrification of moving bodies such as aircraft, vehicles, and ships, a motor system that includes a motor is being mounted and used in moving bodies. For example, the motor system may be mounted in a moving body to rotatably drive a rotor of an electric aircraft, such as an electric Vertical Take-Off and Landing aircraft (eVTOL), a screw of a ship, or wheels of a vehicle or a train. For example, the motor system may be configured as a system that includes a motor, an inverter circuit that supplies electric power to the motor, and a control apparatus that controls the inverter circuit.

SUMMARY

One aspect of the present disclosure provides an abnormality diagnosis system for performing an abnormality diagnosis of a plurality of motor systems that include a motor for moving a moving body. The abnormality diagnosis system identifies a comparison target system that is the motor system, among the plurality of motor systems, that is a comparison target in relation to a diagnosis target system that is the motor system to be a target of the abnormality diagnosis. The abnormality diagnosis system acquires a state-related value that is a value that is related to an operation state of the motor from each of the diagnosis target system and the comparison target system. The abnormality diagnosis system performs a comparison of the state-related value that is acquired from the diagnosis target system and the state-related value that is acquired from the comparison target system, and diagnoses a presence or absence of an abnormality in the diagnosis target system using a result of the comparison.

BRIEF DESCRIPTION OF THE DRAWINGS

In the accompanying drawings:

FIG. 10 is a flowchart illustrating steps in a target system identification process according to the fourth embodiment; and FIG. 11 is a flowchart illustrating steps in an abnormality diagnosis process according to a fifth embodiment.

DESCRIPTION OF THE EMBODIMENTS

Figure 1:
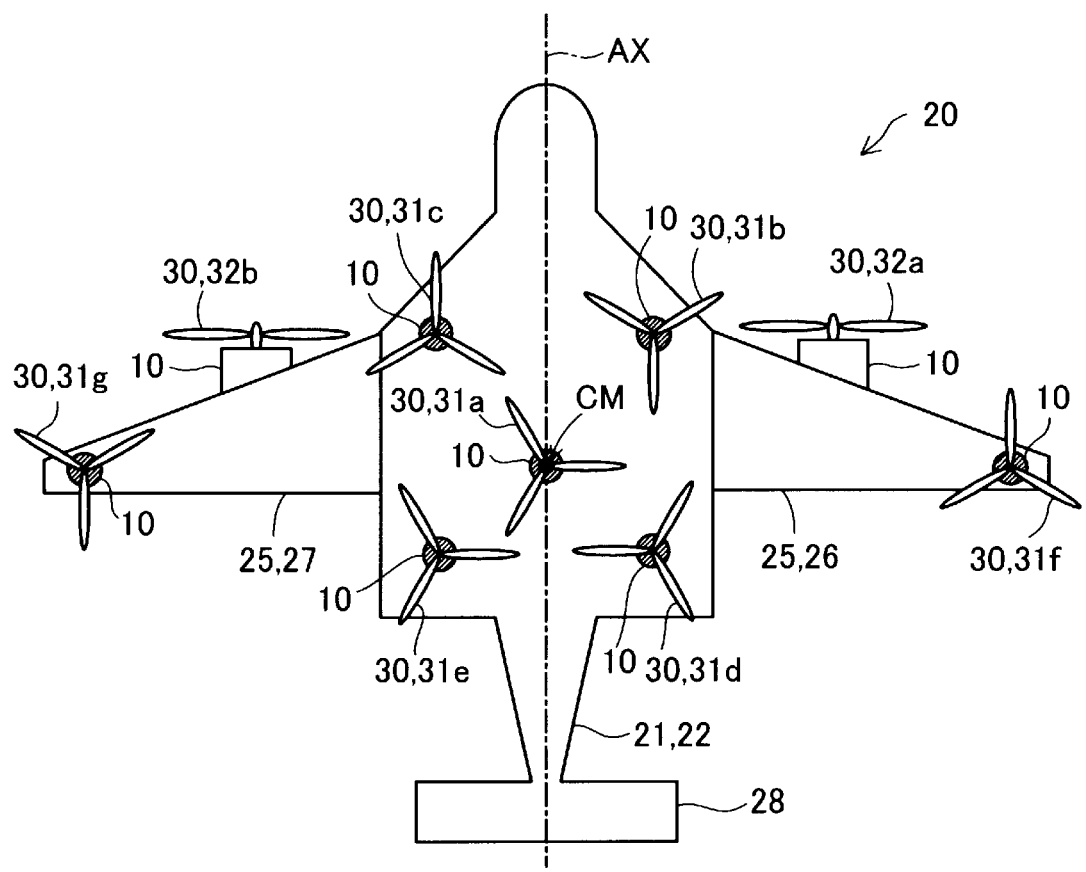
FIG. 1 is a top view schematically illustrating a configuration of an electric aircraft to which an abnormality diagnosis system according to an embodiment of the present disclosure is applied.

In a motor system, an abnormality diagnosis such as a failure diagnosis for a motor described in JP-A-2005-049178 being performed in a manner similar to that in the past is desired. In JP-A-2005-049178, a presence or absence of an abnormality is diagnosed based on a presence or absence of a predetermined feature (a presence or absence of a signal of a specific frequency) in a phase current that is supplied to the motor or a presence or absence of a predetermined feature quantity of a torque current value (q-axis current value) that is determined from a phase current value and an actual measurement value of a motor rotation frequency.

In a diagnosis method in JP-A-2005-049178, the presence or absence of an abnormality is detected through a comparison of a feature quantity of the phase current or the like and a feature quantity that is stored in advance. In addition, for example, as a conventional abnormality diagnosis method differing from that in JP-A-2005-049178, a method in which the presence or absence of an abnormality is detected based on whether the phase current value exceeds a predetermined current range may be used.

In a conventional abnormality diagnosis method such as this, a value and a range that enables the abnormality to be clearly confirmed are set as the feature quantity and the current range for reliable determination of the presence or absence of an abnormality. Therefore, in cases in which an abnormality in which the phase current value is a feature quantity that is smaller than a feature quantity during an abnormality or an abnormality that occurs while the phase current value remains within the predetermined current range occurs, a problem arises in that an occurrence of an abnormality cannot be detected.

Such problems are not limited to a configuration in which the presence or absence of an abnormality is diagnosed based on the phase current, but are also common in a configuration in which the presence or absence of an abnormality is diagnosed based on an arbitrary parameter that is related to operation of the motor system, such as a supplied voltage to the inverter circuit or a temperature of the motor system. Therefore, a technology that enables the presence or absence of an abnormality in a plurality of motor systems to be accurately diagnosed is desired.

An exemplary embodiment of the present disclosure provides an abnormality diagnosis system for performing an abnormality diagnosis of a plurality of motor systems that include a motor for moving a moving body. The abnormality diagnosis system includes: a comparison target identifying unit that identifies a comparison target system that is the motor system, among the plurality of motor systems, that is a comparison target in relation to a diagnosis target system that is the motor system to be a target of the abnormality diagnosis; a state-related value acquiring unit that acquires a state-related value that is a value that is related to an operation state of the motor from each of the diagnosis target system and the comparison target system; and a diagnosing unit that performs a comparison of the state-related value that is acquired from the diagnosis target system and the state-related value that is acquired from the comparison target system, and diagnoses a presence or absence of an abnormality in the diagnosis target system using a result of the comparison.

As a result of the abnormality diagnosis system according to this aspect, the state-related values are respectively acquired from the diagnosis target system and the comparison target system, among the motor systems, and a comparison is performed. The presence or absence of an abnormality in the diagnosis target system is diagnosed using the result of the comparison. Consequently, compared to, for example, a configuration in which a threshold for abnormality detection is set for the state-related value and the presence or absence of an abnormality is diagnosed based on whether the threshold is exceeded, the presence or absence of an abnormality can be more accurately diagnosed.

The exemplary embodiment of the present disclosure can also be actualized according to various aspects. For example, the present disclosure can be actualized according to aspects such as an abnormality diagnosis method for an electric drive system that includes the plurality of motor systems, a moving body, an electric aircraft (aerial vehicle), a vehicle, a ship, or a motor system, a computer program for actualizing these apparatuses and methods, and a non-transitory storage medium in which the computer program is recorded.

The above-described exemplary embodiment of the present disclosure will be further clarified through the detailed description below, with reference to the accompanying drawings.

A. First Embodiment

A1. Apparatus Configuration

An electric aircraft (aerial vehicle) 20 shown in FIG. 1 is also referred to as an eVTOL. The electric aircraft 20 is a manned aircraft that is capable of performing takeoff and landing in a vertical direction and propulsion in a horizontal direction. The electric aircraft 20 includes an airframe 21, nine rotors 30, and nine motor systems 10 that are arranged in correspondence with the rotors.

An airframe 21 corresponds to a portion of the electric aircraft 20 excluding the nine rotors 30 and motor systems 10. The airframe 21 includes a main body portion 22, main wings 25, and a tail assembly 28.

The main body portion 22 configures a body portion of the electric aircraft 20. The main body portion 22 has a configuration that has left-right symmetry with an axial line AX as an axis of symmetry. According to the present embodiment, the "axial line AX" refers to an axis that passes through a gravitational center position CM of the electric aircraft 20 and runs along a front/rear direction of the electric aircraft 20. In addition, the "gravitational center position CM" refers to a gravitational center position of the electric aircraft 20 at empty weight when occupants are not onboard. An occupant cabin (not shown) is formed inside the main body portion 22.

The main wings 25 are configured by a right wing 26 and a left wing 27. The right wing 26 is formed so as to extend in a rightward direction from the main body portion 22. The left wing 27 is formed so as to extend in a leftward direction from the main body portion 22. The rotors 30 and the motor systems 10 are arranged, two each, in each of the right wing 26 and the left wing 27. The tail assembly 28 is formed in a rear end portion of the main body portion 22.

Of the nine rotors 30, five are arranged in a center portion on an upper surface of the main body portion 22. These five rotors 30 function as lifting rotors 31a to 31e that are mainly for achieving lifting force of the airframe 21. The lifting rotor 31a is arranged in a position that corresponds to the gravitational center position CM. The lifting rotors 31b and 31c are arranged in positions that are linearly symmetrical to each other with the axial line AX at the center, in front of the lifting rotor 31a. The lifting rotors 31d and 31e are arranged in positions that are linearly symmetrical to each other with the axial line AX at the center, to the rear of the lifting rotor 31a. Of the nine rotors 30, two are arranged in the right wing 26 and the left wing 27. Specifically, the lifting rotor 31f is arranged on an upper surface in a tip end portion of the right wing 26 and the lifting rotor 31g is arranged on an upper surface in a tip end portion of the left wing 27.

Of the nine rotors 30, further two are respectively arranged in the right wing 26 and the left wing 27, and mainly function as propulsion rotors 32a and 32b for achieving propulsion force in the horizontal direction of the airframe 21. The propulsion rotor 32a that is arranged in the right wing 26 and the propulsion rotor 32b that is arranged in the left wing 27 are arranged in positions that are linearly symmetrical to each other with the axial line AX at the center. The rotors 30 are rotatably driven independent of one another around respective rotation axes (shafts 17, described hereafter). The rotors 30 each have three blades that are arranged at equal angular intervals from each other.

Figure 2:
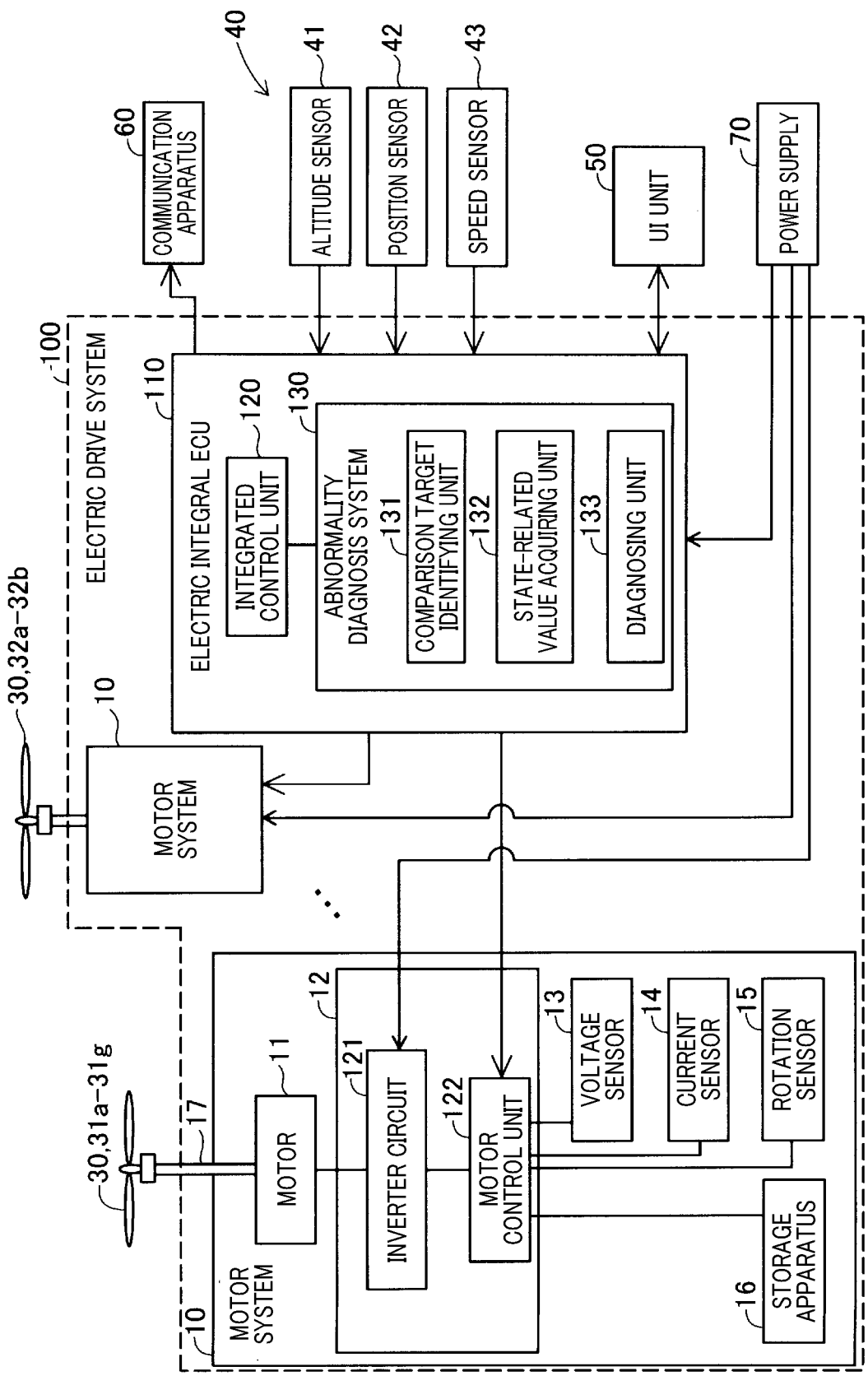
FIG. 2 is a block diagram illustrating a functional configuration of an electric drive system that includes a motor system.

As shown in FIG. 2, the total of nine motor systems 10 that correspond to the rotors 30 are configured as a part of an electric drive system 100. The electric drive system 100 is a system that controls each motor system 10 based on a flight program that is set in advance or piloting by an occupant or from outside, and rotatably drives the rotors 30.

The nine motor systems 10 have substantially identical configurations to one another. Each motor system 10 includes a motor 11, an inverter unit (INV unit) 12, a voltage sensor 13, a current sensor 14, a rotation sensor 15, a storage apparatus 16, and the shaft 17. The motor system 10 is a system that rotates the rotor 30 such that a rotational torque and a rotation frequency that are based on a command from an electric integral electronic control unit (ECU) 110, described hereafter, are achieved.

The motor 11 rotatably drives the rotor 30 through the shaft 17. According to the present embodiment, the motor 11 is configured by a three-phase alternating-current brushless motor. The motor 11 rotates the shaft 17 based on a voltage and a current that are supplied from an inverter circuit 121, described hereafter. Here, the motor 11 may be configured by an arbitrary type of motor, such as an induction motor or a reluctance motor, instead of the brushless motor.

The inverter unit 12 includes the inverter circuit 121 and a motor control unit 122. The inverter circuit 121 has a power element such as an insulated-gate bipolar transistor (IGBT) or a metal-oxide-semiconductor field-effect transistor (MOSFET). The inverter circuit 121 supplies electric driving power to the motor 11 by performing switching at a duty ratio that is based on a control signal that is supplied by the motor control unit 122.

The motor control unit 122 controls the overall motor system 10. Specifically, the motor control unit 122 generates a drive signal that is based on an instruction from an integrated control unit 120, described hereafter, and supplies the drive signal to the inverter circuit 121. In addition, the motor control unit 122 performs feedback control of the inverter circuit 121 using detection values of the sensors 13 to 15. According to the present embodiment, the motor control unit 122 is configured by a microcomputer that has a central processing unit (CPU), a read-only memory (ROM), and a random access memory (RAM).

The voltage sensor 13 detects a voltage that is supplied from a power supply 70, described hereafter. The current sensor 14 is provided between the inverter circuit 121 and the motor 11, and detects a drive current (phase current) of each phase of the motor 11. The rotation sensor 15 detects a rotation frequency of the motor 11. The detection values of the voltage sensor 13, the current sensor 14, and the rotation sensor 15 are stored in a storage apparatus 117 in time series and outputted to the electric integral ECU 110 through the motor control unit 122. The storage apparatus 16 stores therein various control programs, as well as results of an abnormality diagnosis process described hereafter and a history of the results of the abnormality diagnosis process performed by the user, in addition to the detection values of the various sensors.

The electric drive system 100 includes the electric integral ECU 110 in addition to the nine motor systems 10, described above. The electric integral ECU 110 performs overall control of the electric drive system 100 and performs abnormality diagnosis of the motor systems 10. According to the present embodiment, the electric integral ECU 110 is configured by a computer that includes a CPU, a ROM, and a RAM. The CPU that is provided in the electric integral ECU 110 functions as the integrated control unit 120 and an abnormality diagnosis system 130 by opening and running, in the RAM, a control program that is stored in the ROM in advance.

The integrated control unit 120 controls each motor system 10 based on a flight program that is set in advance or steering of a control stick by the user. At this time, the integrated control unit 120 periodically transmits a target control value to each motor system 10. The "target control value" is a value that serves as a target when control of the motor system 10 is performed. According to the present embodiment, a target rotation frequency of the motor 11 is applicable. Here, a target torque value may be applicable as the target control value, instead of the target rotation frequency or in addition to the target rotation frequency. According to the present embodiment, a transmission interval of the target control value is 20 milliseconds (msec). Here, the transmission interval is not limited to 20 msec and may be an arbitrary period.

The abnormality diagnosis system 130 is a system for performing an abnormality diagnosis of each motor system 10. The abnormality diagnosis system 130 includes a comparison target identifying unit 131, a state-related value acquiring unit 132, and a diagnosing unit 133.

The comparison target identifying unit 131 identifies the motor system 10 (referred to, hereafter, as a "comparison target system") that serves as a comparison target in relation to a diagnosis target system.

The state-related value acquiring unit 132 acquires values (referred to, hereafter, as "state-related values") that are related to an operation state of the motor 11 from both the diagnosis target system and the comparison target system. According to the present embodiment, the state-related value is a phase current value that is detected by the current sensor 14.

The diagnosing unit 133 compares the state-related values that are acquired from both the diagnosis target system and the comparison target system, and determines a presence or absence of an abnormality in the diagnosis target system using the comparison result. Details of the abnormality diagnosis will be described hereafter.

Various constituent elements for performing flight and abnormality diagnosis are mounted in the electric aircraft 20, in addition to the above-described electric drive system 100. Specifically, a sensor group 40, a user interface unit 50 (referred to as a "UI unit" 50), a communication apparatus 60, and a power supply 70 are mounted in the electric aircraft 20.

The sensor group 40 includes an altitude sensor 41, a position sensor 42, and a speed sensor 43. The altitude sensor 41 detects a current altitude of the electric aircraft 20. The position sensor 42 identifies a current position of the electric aircraft 20 as a longitude and a latitude. According to the present embodiment, the position sensor 42 is configured by a global navigation satellite system (GNSS). For example, as the GNSS, the Global Positioning System (GPS) may be used. The speed sensor 43 detects a speed of the electric aircraft 20.

The UI unit 50 provides an occupant of the electric aircraft 20 with a user interface for control of the electric aircraft 20 and monitoring of the operation state. For example, the user interface includes an operation input unit such as a keyboard or a button, and a display unit such as a liquid crystal panel. For example, the UI unit 50 may be provided in a cockpit of the electric aircraft 20. A crew member can make changes to an operation mode of the electric aircraft 20 and perform operation testing of each motor system 10 using the UI unit 50.

The communication apparatus 60 performs communication with other electric aircrafts, a control tower on the ground, and the like. For example, a commercial-use very high frequency (VHF) radio is applicable as the communication apparatus 60. Here, the communication apparatus 60 may be configured by an apparatus that performs communication through a wireless local area network (LAN) that is defined by IEEE 802.11 or a wired LAN defined by IEEE 802.3, in addition to the commercial-use VHF. The power supply 70 is configured by a lithium-ion battery and functions as one of the electric power supply sources of the electric aircraft 20. The power supply 70 supplies three-phase alternating-current power to the motor 11 through the inverter circuit 121 of each motor system 10. Here, the power supply 70 may be configured by an arbitrary secondary battery such as a nickel-hydrogen battery, instead of the lithium-ion battery. The power supply 70 may be configured by an arbitrary electric power supply source, such as a fuel cell or a power generator, instead of the secondary battery or in addition to the secondary battery.

A2. Abnormality Diagnosis Process

Figure 3:
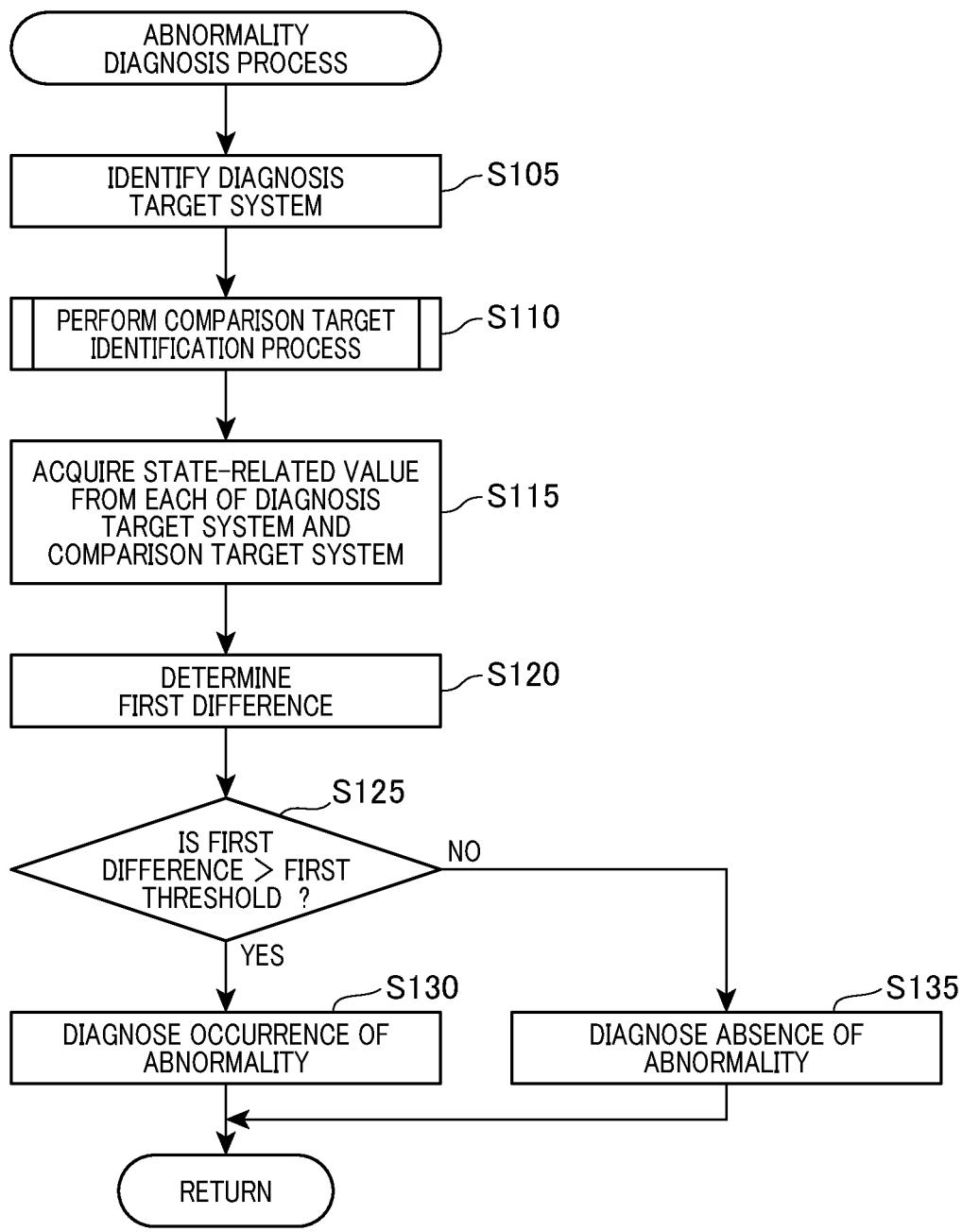
FIG. 3 is a flowchart illustrating steps in an abnormality diagnosis process according to a first embodiment.

The abnormality diagnosis process shown in FIG. 3 is started when power of the electric integral ECU 10 is turned on. The diagnosing unit 133 identifies a diagnosis target system among the nine motor systems 10 (step S105). According to the present embodiment, an order by which the nine motor systems 10 are identified as the diagnosis target system is prescribed in advance for the nine motor systems 10. Then, the diagnosing unit 133 identifies the diagnosis target system based on this order.

Figure 4:
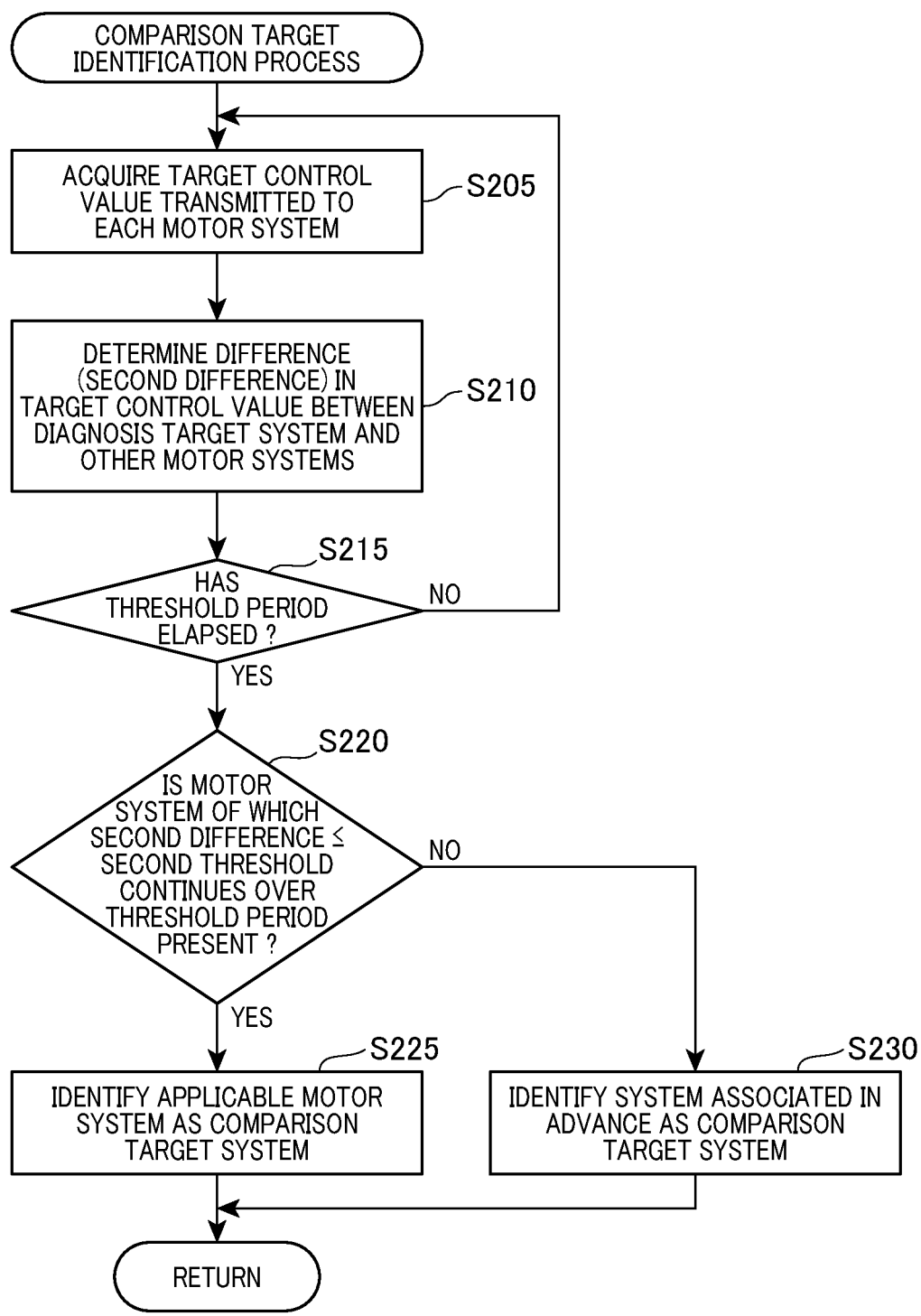
FIG. 4 is a flowchart illustrating steps in a comparison target identification process according to the first embodiment.

The comparison target identifying unit 131 performs a comparison target identification process and identifies the comparison target system (step S110). As shown in FIG. 4, first, the comparison target identifying unit 131 acquires the target control value, that is, the target rotation frequency that is transmitted from the integrated control unit 120 to each motor system 10 (step S205). At this time, the target control values that are respectively transmitted to the other eight motor systems 10, in addition to the diagnosis target system, are acquired.

The comparison target identifying unit 131 determines a difference (referred to, hereafter, as a "second difference") in target control value between the diagnosis target system and the other motor systems 10 (step S210). The comparison target identifying unit 131 determines whether a threshold period has elapsed from the start of the comparison target identification process (Step S215). According to the present embodiment, the threshold period is 100 msec. Here, the threshold period is not limited to 100 msec and may be an arbitrary period. When determined that the threshold period has not elapsed (NO at step S215), the process returns to above-described step S205.

Conversely, when determined that the threshold period has elapsed (YES at step S215), the comparison target identifying unit 131 determines whether the motor system 10 of which the second difference continues to be equal to or less than a second threshold during a threshold period is present (step S220). The threshold period at step S220 is the same threshold period as that at step S215. According to the present embodiment, the second threshold is a value that is 10% of the target control value of the diagnosis target system. Here, the second threshold is not limited to 10% and may be an arbitrary percentage, such as 5% or 15%, at which the values can be considered to be similar to each other. In addition, for example, the second threshold may be a fixed value such as 100 rpm.

As described above, the integrated control unit 120 transmits the target control value to each motor system 10 (motor control unit 122) every 20 msec. Therefore, at step S220, whether the motor system 10 of which the target control value has continued to be equal to or less than the second threshold during 100 msec, that is, the values being considered similar to each other, occurs five consecutive times is present is determined.

When determined that the motor system 10 of which the second difference is continuously equal to or less than the second threshold during the threshold period is present (YES at step S225), the comparison target identifying unit 131 identifies the applicable motor system 10 as the comparison target system (step S225). The motor system 10 of which the second difference has been continuously equal to or less than the second threshold during the threshold period continuously receives the target control value that is similar to that of the diagnosis target system from the integrated control unit 120 during the threshold period. Therefore, the applicable motor system 10 is estimated to be in an operation state that is similar to that of the diagnosis target system when the motor system 10 is controlled based on the target control value.

Here, when a plurality of applicable motor systems 10 are present, according to the present embodiment, the motor system 10 of which a total value of the second difference during the threshold period is smallest is identified as the comparison target system. Here, the comparison target system may be selected and identified by an arbitrary selection method, such as the motor system 10 of which a period from when the motor system 10 had previously been the comparison target system is longest, or the motor system 10 that has a highest priority level among priority levels that are set for the motor systems 10 in advance, instead of the motor system 10 of which the total value of the second difference during the threshold period is the smallest.

When determined that there is no motor system 10 of which the second difference is continuously equal to or less than the second threshold during the threshold period (NO at step S225), the comparison target identifying unit 131 identifies the motor system 10 that is associated with the diagnosis target system in advance as the comparison target system (step S230). According to the present embodiment, the comparison target system is associated with each motor system 10 in advance in preparation for when step S230 is performed. Then, when step S225 is not performed and step S230 is performed, the comparison target system is identified based on this association. After completion of step S225 or step S230, the process proceeds to step S115 in FIG. 3.

As shown in FIG. 3, the state-related value acquiring unit 132 respectively acquires the state-related values from both of the diagnosis target system and the comparison target system (step S115). As described above, according to the present embodiment, the state-related value is the phase current value that is detected by the current sensor 14. The state-related value acquiring unit 132 acquires the detection value of the current sensor 14 by inquiring the motor control unit 122 of the motor system 10. According to the present embodiment, the phase current value that is acquired at step S115 is an average value during a predetermined period of the current values for a U phase, a V phase, and a W phase. For example, the predetermined period may be 100 msec.

The diagnosing unit 133 determines a difference (referred to, hereafter, as a "first difference") between the state-related value of the diagnosis target system and the state-related value of the comparison target system (step S120). At step S120, the diagnosing unit 133 determines respective differences for the U phase, the V phase, and the W phase as the first difference. Here, according to the present embodiment, the first difference is a positive value. That is, the first difference refers to a value that is determined by a smaller state-related value being subtracted from a larger state-related value.

The diagnosing unit 133 determines whether the first difference that is determined at step S120 is greater than a first threshold (step S125). According to the present embodiment, whether at least the difference for one phase, of the respective differences for the phases that are the U phase, the V phase, and the W phase, is greater than the first threshold is determined. The first threshold is set by being acquired in advance through an experiment or a simulation, such as a following. That is, two motor systems 10 that differ from each other are provided the same target control value and operated. At this time, the same target control value is provided to each of a pair (referred to, hereafter, as a "first pair") in which an abnormality is made to occur in advance in one motor system 10 and the other motor system 10 is normal, and a pair (referred to, hereafter, as a "second pair") that is composed of two motor systems 10 that are both normal. Then, in each pair, the state-related value, that is, the value of each phase current, is measured. The respective differences are determined. A value that is greater than the difference of the second pair and less than the difference of the first pair is determined as the first threshold.

When determined that the first difference is greater than the first threshold (YES at step S125), the diagnosing unit 133 diagnoses an occurrence of an abnormality (step S130). In contrast, when determined that the first difference is not greater than the first threshold (NO at step S125), the diagnosing unit 133 diagnosis an absence of an abnormality (step S135). When an abnormality has not occurred in the diagnosis target system, the first difference value is highly likely to be a small value. On the other hand, when an abnormality has occurred in the diagnosis target system, operation differs from that of the comparison target system, and the detected state-related value is highly likely to significantly differ from that of the diagnosis target system. Therefore, in this case, the first difference may be a value that is greater than the first threshold. After completion of step S130 or step S135, the process returns to step S105.

A result of the above-described abnormality diagnosis process is displayed in the display unit of the UI unit 50 according to the present embodiment. Here, instead of the display in the UI unit 50 or in addition to the display in the UI unit 50, the result may be stored in a storage unit that is provided in the electric integral ECU 110 as diagnosis history, or notification of the diagnosis result to another apparatus, such as a management server that manages the electric aircraft 20, through the communication apparatus 60 and the like may be performed.

As a result of the abnormality diagnosis system 130 according to the first embodiment described above, the phase current values that are the state-related values are respectively acquired from the diagnosis target system and the comparison target system among the plurality of motor systems 10, and a comparison is performed. The presence or absence of an abnormality in the diagnosis target system is diagnosed using the result of the comparison. Consequently, compared to a configuration in which the diagnosis target system alone is diagnosed, such as a configuration in which a threshold for abnormality detection is set for the phase current value and the presence or absence of an abnormality is diagnosed based on whether the threshold is exceeded, the presence or absence of an abnormality can be more accurately diagnosed.

In addition, when the first difference that is obtained by the state-related value that is acquired from the diagnosis target system and the state-related value that is acquired from the comparison target system being compared is greater than the first threshold, the abnormality is diagnosed as having occurred in the diagnosis target system. Therefore, the process after the state-related values are acquired from the respective systems can be simplified.

Furthermore, when a motor system 10 other than the diagnosis target system that is a motor system 10 of which the second difference that is the difference between the target control value that is transmitted from the integrated control unit 120 and the target control value that is transmitted to the diagnosis target system is continuously equal to or less than the second threshold during the threshold period is present, the motor system 10 is identified as the comparison target system. Therefore, the motor system 10 that is in an operation state similar to that of the diagnosis target system and from which a similar state-related value is highly likely to be acquired can be identified as the comparison target system. Consequently, the presence or absence can be accurately diagnosed when operation-related values of both systems are compared.

B. Second Embodiment

The abnormality diagnosis system 130 according to a second embodiment differs from the abnormality diagnosis system 130 according to the first embodiment in terms of specific steps of the comparison target identification process. An apparatus configuration of the electric aircraft 20 including the abnormality diagnosis system 130 according to the second embodiment and other steps of the abnormality diagnosis process are identical to those of the abnormality diagnosis system 130 according to the first embodiment. Therefore, identical configurations and identical steps are given the same reference numbers. Detailed descriptions thereof are omitted.

Figure 5:
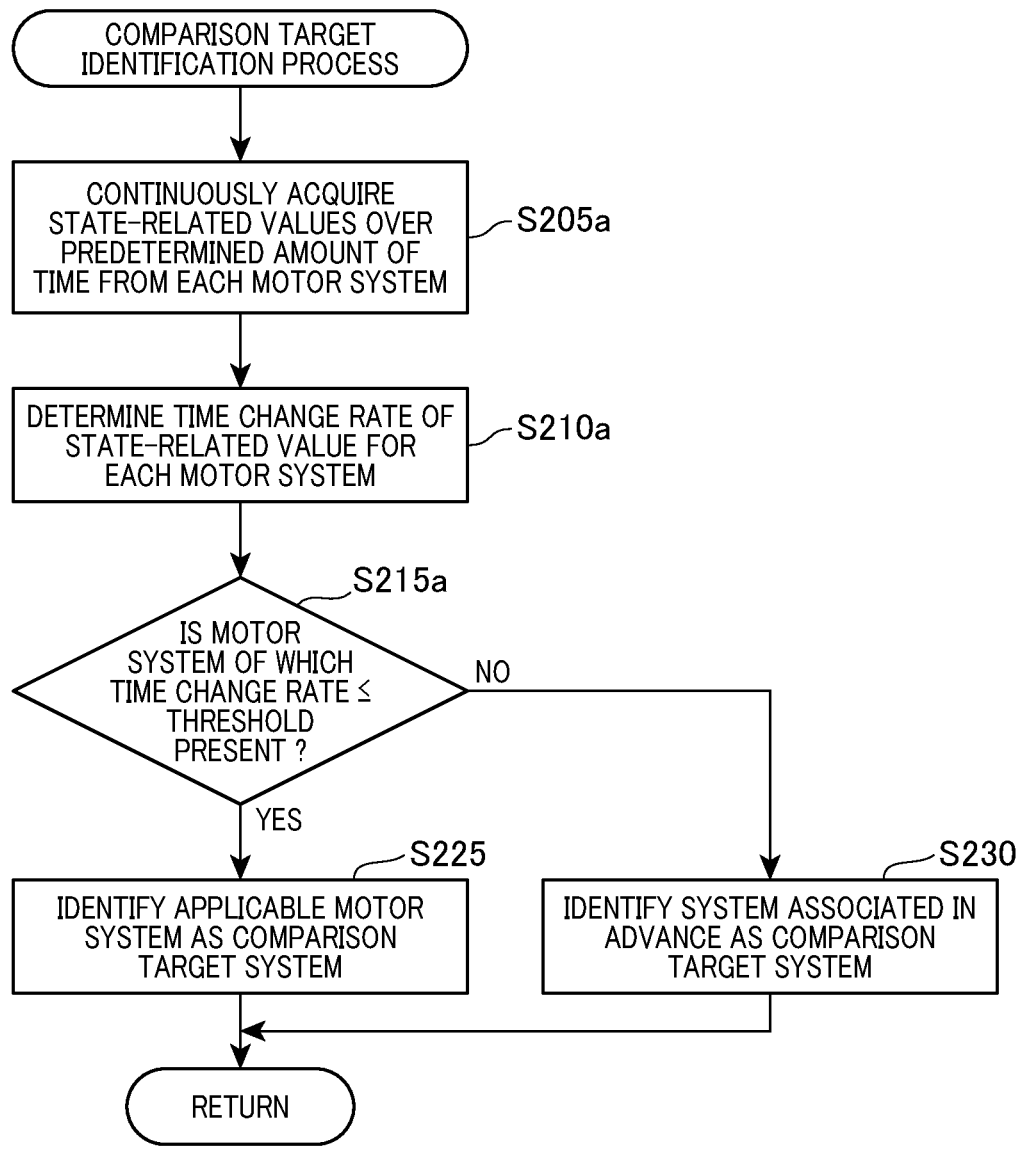
FIG. 5 is a flowchart illustrating steps in a comparison target identification process according to a second embodiment.

As shown in FIG. 5, the comparison target identifying unit 131 continuously acquires the state-related value from each motor system 10 during a predetermined amount of time (step S205*a*). As described above, the state-related value is the phase current value. According to the present embodiment, the predetermined amount of time is 200 msec. Here, the predetermined amount of time is not limited to 200 msec and may be an arbitrary period.

The comparison target identifying unit 131 uses the state-related values that are acquired at step S205*a* and determines a time change rate of the state-related value during the predetermined amount of time for each motor system 10 (step S210*a*). A rate of change in measurement values that are temporally adjacent among measurement values that are acquired during the predetermined amount of time is determined, and the time change rate is determined as an average value of the rates of change. Here, the time change rate may be determined by another arbitrary method, such as the rate of change being determined from a first measurement value and a last measurement value during the predetermined amount of time.

The comparison target identifying unit 131 determines whether the motor system 10 of which the time change rate that is determined at step S210*a* is equal to or less than a threshold change rate is present (step S215*a*). When determined that the motor system 10 of which the time change rate is equal to or less than the threshold change rate is present (YES at step S215*a*), above-described step S225 is performed and the applicable motor system 10 is identified as the comparison target system. Conversely, when determined that the motor system 10 of which the time change rate is equal to or less than the threshold change rate is not present (NO at step S215*a*), above-described step S230 is performed and the motor system 10 that is associated with the diagnosis target system in advance is identified as the comparison target system. After completion of step S225 or step S230, the process proceeds to step S115 shown in FIG. 3.

The abnormality diagnosis system 130 according to the second embodiment described above achieves effects similar to those according to the first embodiment. In addition, when the motor system 10 of which the time change rate of the state-related value is equal to or less than the threshold change rate is present, the applicable motor system 10 is identified as the comparison target system. Therefore, the motor system 10 of which the state-related value does not significantly change and that is in a stable operation state can be identified as the comparison target system. Consequently, the motor system 10 of which the first difference is large as a result of sudden changes in the operation state can be suppressed from being identified as the comparison target system, and decrease in the accuracy of the abnormality diagnosis can be suppressed.

C. Third Embodiment

The abnormality diagnosis system 130 according to a third embodiment differs from the abnormality diagnosis system 130 according to the first embodiment in terms of specific steps of the abnormality diagnosis process. The apparatus configuration of the electric aircraft 20 including the abnormality diagnosis system 130 according to the third embodiment is identical to that of the abnormality diagnosis system 130 according to the first embodiment. Therefore, identical configurations are given the same reference numbers. Detailed descriptions thereof are omitted.

Figure 6:
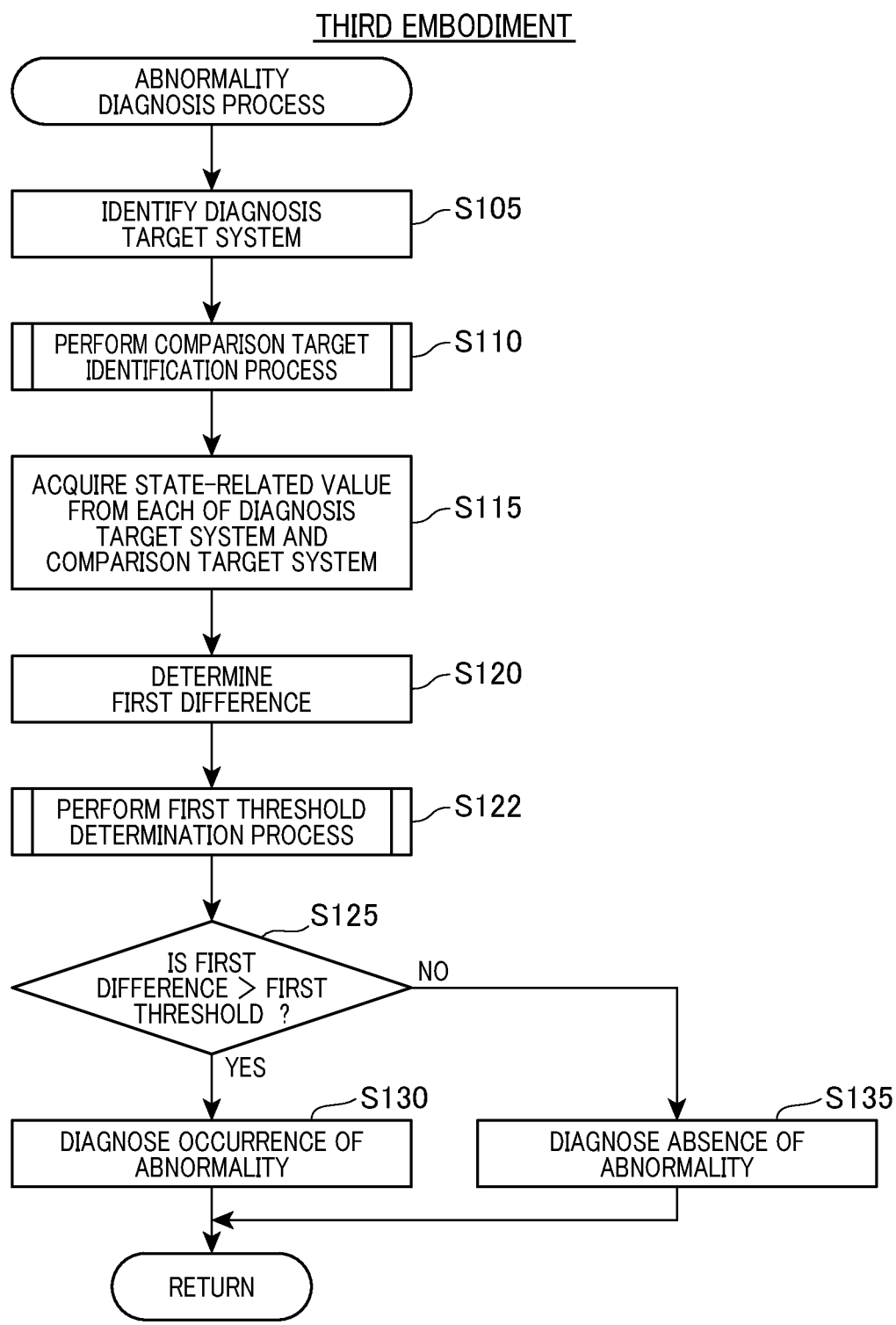
FIG. 6 is a flowchart illustrating steps in an abnormality diagnosis process according to a third embodiment.

The abnormality diagnosis process according to the third embodiment shown in FIG. 6 differs from the abnormality diagnosis process according to the first embodiment shown in FIG. 3 in that step S122 is added and performed. Other steps of the abnormality diagnosis process according to the third embodiment are identical to those according to the first embodiment. Therefore, identical steps are given the same reference numbers. Detailed descriptions thereof are omitted.

As shown in FIG. 6, when step S120 is performed and the first difference is determined, a first threshold determination process is performed (step S122). The first threshold determination process refers to a process for determining the above-described first threshold that is used at step S125.

Figure 7:
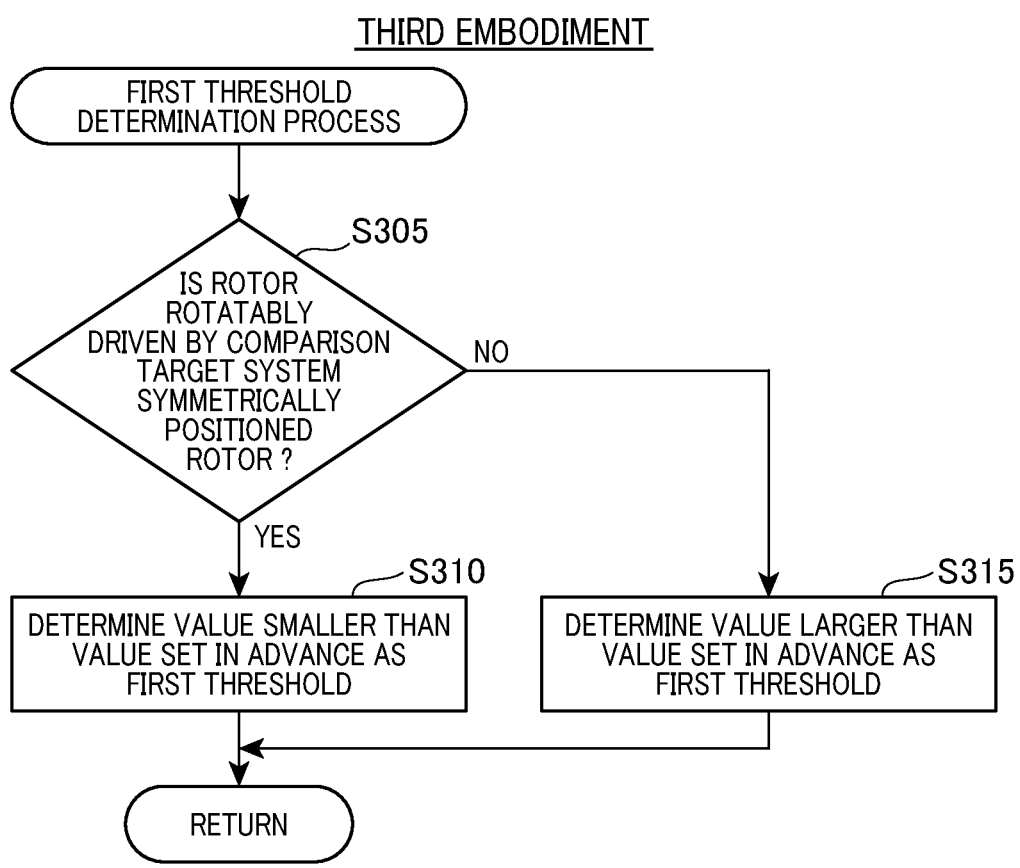
FIG. 7 is a flowchart illustrating steps in a first threshold determination process according to the third embodiment.

As shown in FIG. 7, the diagnosing unit 133 determines whether the rotor 30 that is rotatably driven by the comparison target system determined at step S110 is a symmetrically positioned rotor (step S305). The symmetrically positioned rotor refer to the rotor 30 that is in a position that is point-symmetrical to the rotor 30 that is rotatably driven by the diagnosis target system with the gravitational center position CM of the electric aircraft 20 as the center when viewed in a vertical direction, or the rotor 30 that are linearly symmetrical to the rotor 30 that is rotatably driven by the diagnosis target system with the axial line AX of the electric aircraft 20 that passes through the gravitational center position CM when viewed in a vertical direction.

When determined that the rotor 30 that is rotatably driven by the comparison target system is the symmetrically positioned rotor (YES at step S305), the diagnosing unit 133 determines a value that is smaller than a value that is set in advance as the first threshold (step S310). Conversely, when determined that the rotor 30 that is rotatably driven by the comparison target system is not the symmetrically positioned rotor (NO at step S305), the diagnosing unit 133 determines a value that is larger than the value that is set in advance as the first threshold (step S315). After completion of step S310 or step S315, the process proceeds to step S125 shown in FIG. 6.

The "value that is smaller" at step S310 refers to a value that is smaller compared to the value that is determined at step S315. In a similar manner, the "value that is larger" at step S315 refers to a value that is larger compared to the value that is determined at step S310. A reason for changing a magnitude of the first threshold based on whether the rotor 30 that is rotatably driven by the comparison target system is the symmetrically positioned rotor, as described above, will be described with reference to FIG. 8.

Figure 8:
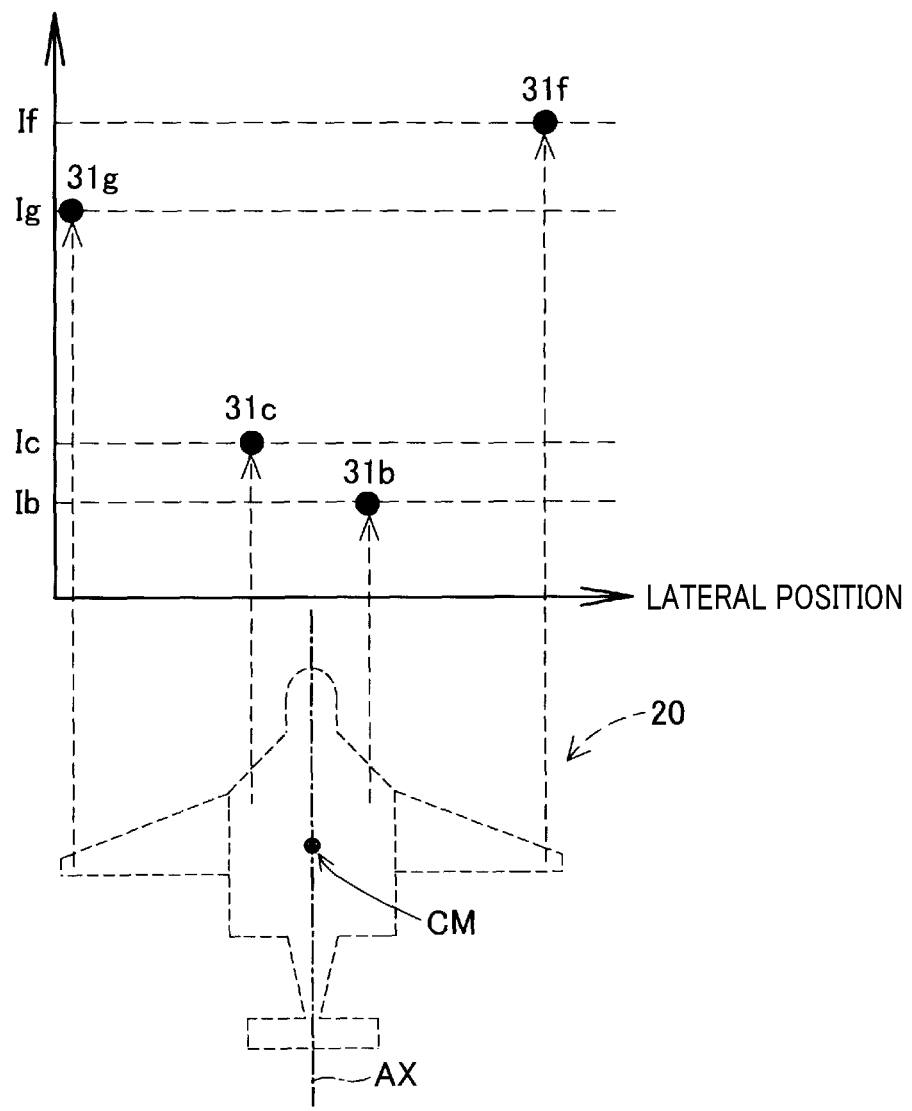
FIG. 8 is an explanatory diagram illustrating arrangement positions of four motor systems and a state-related value of each motor system.

In FIG. 8, a horizontal axis indicates a lateral position of the electric aircraft 20 and a vertical axis indicates the state-related value. In addition, the electric aircraft 20 is schematically shown by broken lines in a lower portion of FIG. 8. In FIG. 8, an example of the state-related values (phase current values) of a total of four motor systems 10 that respectively rotatably drive four lifting rotors 31b, 31c, 31f, and 31g are shown.

As shown in FIG. 8, phase current values Ib and Ic that correspond to the two lifting rotors 31b and 31c that are arranged in positions that are linearly symmetrical to each other with the axial line AX as the center are values that are closer to each other compared to phase current values If and Ig that correspond to the other two lifting rotors 31f and 31g.

In a similar manner, the phase current values If and Ig that correspond to the two lifting rotors 31f and 31g that are arranged in positions that are linearly symmetrical to each other with the axial line AX as the center are values that are closer to each other compared to the phase current values Ib and Ic that correspond to the other two lifting rotors 31b and 31c. When the electric aircraft 20 ascends and descends, an attitude of the airframe 21 is required to be kept parallel to a horizontal direction. Therefore, the two lifting rotors that are arranged in positions that are linearly symmetrical to each other with the axial line AX as the center operate at rotation frequencies that are similar to each other.

As a result, the phase current values that correspond to these two lifting rotors 30 are values that are close to each other. In this manner, when the rotor 30 that is rotatably driven by the comparison target system is the symmetrically positioned rotor, the phase current values are values that are close to each other. Therefore, the first difference is a small value in a normal state as well. Therefore, in this case, the first threshold is set to a relatively small value and an abnormal state is able to be accurately diagnosed.

Meanwhile, when the rotor 30 that is rotatably driven by the comparison target system is not the symmetrically positioned rotor, the phase current values may be values that significantly differ from each other. Therefore, the first difference is a large value in the normal state as well. Therefore, in this case, the first threshold is set to a relatively large value and the abnormal state is able to be accurately diagnosed.

Here, in FIG. 8, the phase current values (state-related values) of the two lifting rotors that are arranged in positions that are linearly symmetrical to each other with the axial line AX as the center are described. However, even in the motor systems 10 that rotatably drive the rotors 30 that are in positions that are point-symmetrical to each other with the gravitational center position CM as the center, values that are close to each other are detected as the state-related values (phase current values). For example, the lifting rotor 31b and the lifting rotor 31e shown in FIG. 1 may be in positions that are point-symmetrical to each other with the gravitational center position CM as the center. Therefore, the phase current values that correspond to these two lifting rotors 31b and 31e are values that are close to each other. Consequently, the first threshold when the motor system 10 that rotatably drives the lifting rotor 31b is the diagnosis target system and the motor system 10 that rotatably drives the lifting rotor 31e is the comparison target system is set to a relatively small value.

The abnormality diagnosis system 130 according to the third embodiment described above achieves effects that are similar to those of the abnormality diagnosis system 130 according to the first embodiment. In addition, because the first threshold when the rotor 30 that is rotatably driven by the comparison target system is the symmetrically positioned rotor is smaller than the first threshold when the rotor 30 is not the symmetrically positioned rotor, the presence or absence of an abnormality can be accurately diagnosed.

In general, the rotors that are in mutually symmetrical positions perform similar operations. Therefore, the state-related values tend to be values that are similar to each other. In contrast, the rotors that are not in mutually symmetrical positions perform operations that differ from each other. Therefore, the state-related values tend to be values that differ from each other. Consequently, in the abnormality diagnosis system according to the present embodiment, the presence or absence of an abnormality can be accurately diagnosed.

D. Fourth Embodiment

Figure 9:
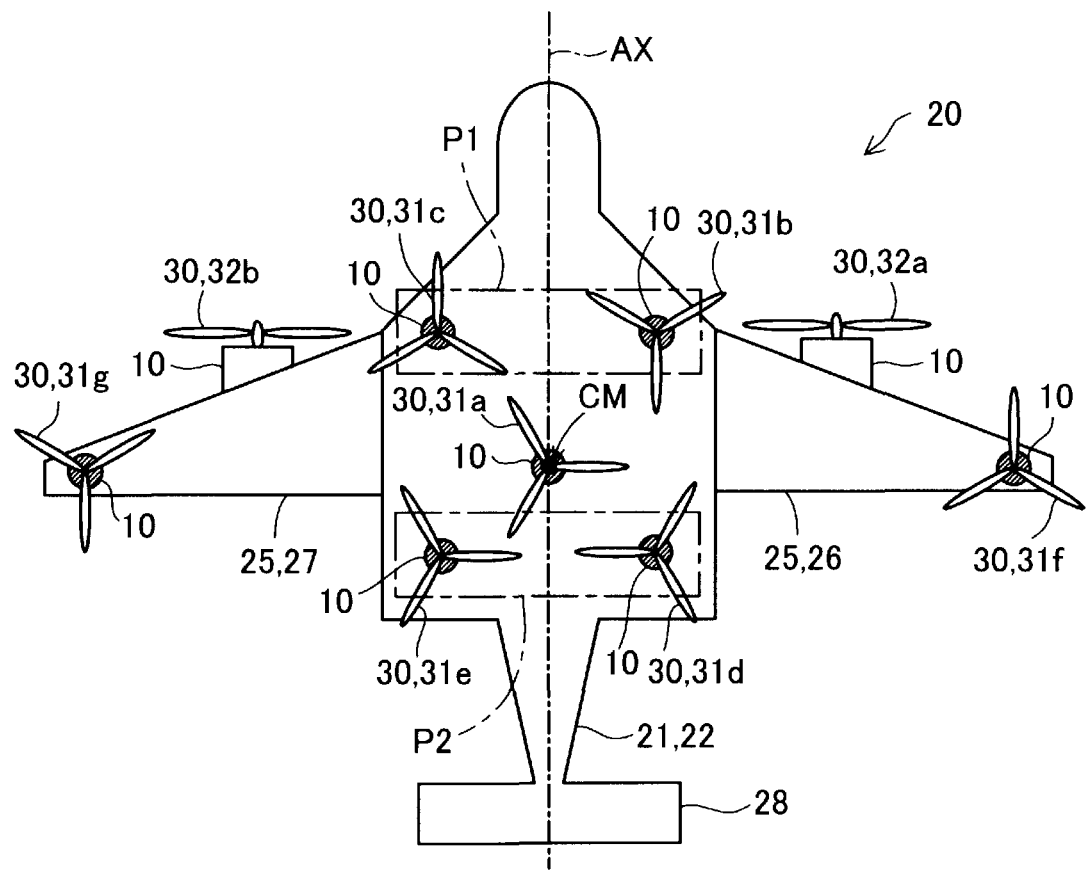
FIG. 9 is an explanatory diagram illustrating an example of pairing of motor systems according to a fourth embodiment.

According to a fourth embodiment, the operation of the comparison target system is actively controlled to match the operation of the diagnosis target system, and the state-related values are made to be values that are close to each other. Specifically, as shown in FIG. 9, for example, the lifting rotor 31b and the lifting rotor 31c may be set in advance as a first pair P1, and the lifting rotor 31d and the lifting rotor 31e may be set in advance as a second pair P2. During ascent and descent, the integrated control unit 120 performs control such that the first pair P1 and the second pair P2 alternate, at a predetermined cycle, between the two lifting rotors that configure a pair being made to perform a same operation and the other pair being made to rotate as required at a rotation frequency that is necessary to attain the lifting force for ascent and descent. Regarding the two lifting rotors that configure each of the pairs P1 and P2, the rotors 30 that are mutually rotatably driven are the above-described symmetrically positioned rotors according to the third embodiment. Here, the other five rotors 30 are not set to be pairs.

According to the fourth embodiment, the abnormality diagnosis system 130 performs a target system identification process shown in FIG. 10. The target system identification process refers to a process for identifying the diagnosis target system and the comparison target system. According to the present embodiment, regarding the other five rotors excluding the total of four rotors 30 that are included in the two pairs P1 and P2, the diagnosis target system and the comparison target system are identified in a manner similar to that according to the first embodiment. Meanwhile, regarding the four rotors 30 that are included in the two pairs P1 and P2, the diagnosis target system and the comparison target system are identified by the target system identification process.

As shown in FIG. 10, the comparison target identifying unit 131 identifies the pair that are controlled to the same operation as a current target pair based on a notification from the integrated control unit 120 (step S405). The target pair refers to a pair that is subject to identification of the diagnosis target system and the comparison target system.

The comparison target identifying unit 131 sets the motor system 10 that corresponds to one rotor 30 of the target pair as the diagnosis target system and the motor system 10 that corresponds to the other rotor 30 as the comparison target system (step S410). When the diagnosis target system and the comparison target system are identified in this manner, steps S115 to S130 or steps S115 to S135 in FIG. 3 are performed, and the abnormality diagnosis for the diagnosis target system is performed. Here, after completion of step S130 or S135, in the target pair, the diagnosis target system and the comparison target system may be interchanged, and steps S115 to S130 or steps S115 to S135 may be performed again.

The abnormality diagnosis system 130 according to the fourth embodiment described above achieves effects similar to those of the abnormality diagnosis system 130 according to the first embodiment. In addition, the operation of the comparison target system is actively controlled to match the operation of the diagnosis target system, and the state-related values are made to be values that are close to each other. Therefore, the first difference in a normal state can be controlled to be a relatively small value. Consequently, the first difference during an occurrence of an abnormality can be made significantly greater compared to that in a normal state, and the abnormal state can be accurately diagnosed.

E. Fifth Embodiment

The abnormality diagnosis system 130 according to a fifth embodiment differs from the abnormality diagnosis system 130 in terms of specific steps of the abnormality diagnosis process. The apparatus configuration of the electric aircraft 20 including the abnormality diagnosis system 130 according to the fifth embodiment is identical to that of the abnormality diagnosis system 130 according to the first embodiment. Therefore, identical configurations are given the same reference numbers. Detailed descriptions thereof are omitted.

The abnormality diagnosis process according to the fifth embodiment shown in FIG. 11 differs from the abnormality diagnosis process according to the first embodiment shown in FIG. 3 in that step S130a is performed instead of step S130 and step S135a is performed instead of step S135. Other steps of the abnormality diagnosis process according to the fifth embodiment are identical to those according to the first embodiment. Therefore, identical steps are given the same reference numbers. Detailed descriptions thereof are omitted.

When determined that the first difference is greater than the first threshold (YES at step S125), the diagnosing unit 133 diagnoses an occurrence of an abnormality in both of the diagnosis target system and the comparison target system (step S130a). Conversely, when determined that the first difference is not greater than the first threshold (NO at step S125), the diagnosing unit 133 diagnoses an absence of an abnormality in both of the diagnosis target system and the comparison target system (step S135a). After completion of step S130a or step S135a, the process returns to step S105.

The abnormality diagnosis system 130 according to the fifth embodiment described above achieves effects similar to those of the abnormality diagnosis system 130 according to the first embodiment. In addition, when the first difference is determined to be greater than the first threshold, an occurrence of an abnormality is diagnosed in both of the diagnosis target system and the comparison target system. Therefore, even if the first difference is greater than the first threshold because an abnormality has occurred in the comparison target system, the occurrence of an abnormality in the comparison target system can be accurately diagnosed.

Furthermore, when the first difference is determined to not be greater than the first threshold, an absence of an abnormality is diagnosed in both of the diagnosis target system and the comparison target system. Therefore, the abnormality diagnosis being performed again with the current comparison target system as the diagnosis target system can be omitted. Time required for the abnormality diagnosis and processing load on the electric integral ECU 110 can be reduced.

F. Other Embodiments (F1) The method for identifying the comparison target system is not limited to the method disclosed according to each embodiment. For example, in the motor systems 10, when a portion is a system (referred to, hereafter, as a "high-reliability system") that has relatively high reliability and the remaining is a system (referred to, hereafter, as a "low-reliability system") that has relatively low reliability, the comparison target system may be identified in a following manner. For example, when the diagnosis target system is a low-reliability system, a high-reliability system may be used as the comparison target system. In this configuration, when the first difference is greater than the first threshold, an abnormality may be determined to have occurred in the diagnosis target system. In addition, for example, when the diagnosis target system is a low-reliability system, a low-reliability system may be used as the comparison target system.

In this configuration, when the first difference is greater than the first threshold, an abnormality may be determined to have occurred in the comparison target system as well, in addition to the diagnosis target system. Because the diagnosis target system and the comparison target system are both low-reliability systems, the likelihood of an abnormality occurring is equal. Therefore, as a result of the determination as described above, an abnormality being erroneously diagnosed as not having occurred in a system in which an abnormality has occurred can be suppressed. In addition, for example, when the diagnosis target system is a high-reliability system, a high-reliability system may be used as the comparison target system.

In this configuration as well, for a reason similar to that of the above-described configuration, when the first difference is greater than the first threshold, the abnormality may be determined to have occurred in the comparison target system as well, in addition to the diagnosis target system. Here, for example, as the high-reliability system, a system in which at least a portion of the constituent elements of the motor system 10 has a redundant system is applicable. As the low-reliability system, a system that does not have such a redundant system is applicable.

(F2) According to the embodiments, the state-related value is the phase current value. However, the present disclosure is not limited thereto. For example, at least one of a voltage value that is supplied from the power supply 70 to the inverter circuit 121 and a temperature value of the motor system 10 may be used as the state-related value. The temperature value of the motor system 10 is a representative temperature of the motor system 10 and, for example, refers to a temperature that is acquired from a temperature sensor that is set near the inverter circuit 121, a temperature that is acquired from a temperature sensor that is arranged so as to be in contact with a casing of the motor system 10, or an estimation temperature of an interior of the motor system 10 that is acquired by a detection temperature of a temperature sensor that is set outside the motor system 10 being applied to a predetermined table or calculation formula. The voltage value that is supplied from the power supply 70 to the inverter circuit 121 and the temperature value of the motor system 10 are related to the operation state of the motor system 10.

Specifically, a drive voltage of the motor 11 tends to increase as the voltage value that is supplied to the inverter circuit 121 increases. In addition, an amount of heat generation in the inverter circuit 121 and the motor 11 increases and the temperature value of the motor system 10 increases as the rotation speed and the torque of the motor 11 increases. In this configuration, at least either of the voltage value that is supplied from the power supply 70 to the inverter circuit 121 and the temperature value of the motor system 10 is used as the state-related value. Therefore, the abnormality diagnosis can be performed using a parameter that has a relatively large time constant as the state-related value.

Therefore, for example, differences in the state-related value occurring as a result of differences between a timing at which the state-related value is acquired from the diagnosis target system and a timing at which the state-related value is acquired from the comparison target value can be suppressed. The diagnosis of the presence or absence of an abnormality using the result of the comparison of the state-related values can be made a more accurate diagnosis. In addition, the state-related value is not limited to the supplied voltage value to the inverter circuit 121 and the temperature value of the motor, described above. For example, the rotation frequency of the motor 11, a rotation speed of the motor 11, or the torque of the motor 11 may be used as the state-related value.

(F3) According to the third embodiment, the value of the first threshold is set based on whether the rotor 30 that is rotatably driven by the comparison target system is a symmetrically positioned rotor. However, the present disclosure is not limited thereto. For example, in a configuration in which some plurality of rotors 30 among the plurality of rotors 30 are arranged so as to be shifted in an axial direction from each other on the same shaft 17, unlike the configurations according to the embodiments, the value of the first threshold may be set based on whether the rotor 30 that is rotatably driven by the comparison target system is the rotor 30 that has a same rotation axis as the rotor 30 that is rotatably driven by the diagnosis target system.

When the rotor 30 that is rotatably driven by the comparison target system is the rotor 30 that has a same rotation axis as the rotor 30 that is rotatably driven by the diagnosis target system, both rotors 30 are in operation states that are similar to each other, and the state-related values may be values that are close to each other. Therefore, in this case, a relatively small value may be set as the first threshold.

(F4) According to the embodiments, the presence or absence of an abnormality is diagnosed based on whether the difference (first difference) between the state-related value of the diagnosis target system and the state-related value of the comparison target system is greater than the first threshold. However, the present disclosure is not limited thereto. For example, the presence or absence of an abnormality may be diagnosed based on whether a proportion of the state-related value of the diagnosis target value in relation to the state-related value of the comparison target system is within a predetermined proportion range.

In this configuration, the absence of an abnormality is diagnosed when the proportion of the state-related value of the diagnosis target system in relation to the state-related value of the comparison target system is within the predetermined proportion range, and the occurrence of an abnormality is diagnosed when the proportion is outside the predetermined proportion range. For example, the predetermined proportion range may be equal to or greater than 90% and equal to or less than 110%. In addition, the predetermined proportion range is not limited to this range and may be set to an arbitrary range.

(F5) According to the embodiments, the abnormality diagnosis process is started when the power of the electric integral ECU 110 is turned on. However, the present disclosure is not limited thereto. For example, the abnormality diagnosis process may be performed when, in addition to the power of the electric integral ECU 110 being turned on, (Condition 1) or (Condition 2), below, is met.

(Condition 1) The diagnosis target system is in operation.
(Condition 2) The diagnosis target system is stopped.

"Stopped" in the above-described (Condition 2) has a wide interpretation that includes a stopped state in which energization to the motor control unit 122 is performed but power supply to the motor 11 is not performed, a startup state in which startup from the stopped state is being performed, and a state immediately before the power of the motor system 10 is turned off (a state from when a command for power-off is outputted from the electric integral ECU 110 until power supply to the motor system 10 is actually stopped).

In addition, in this configuration, an execution trigger for the abnormality diagnosis process may differ based on a diagnostic item. For example, when the detection values of the sensors 14 to 16 are the operation-related values, the abnormality diagnosis process may be performed with the power of the electric integral ECU 110 being turned on and the above-described (Condition 1) being met as the trigger. Furthermore, for example, when offset values of the sensors 14 to 16 are diagnosed, the abnormality diagnosis process may be performed with the power of the electric integral ECU 110 being turned on and the above-described (Condition 2) being met as the trigger.

(F6) The configurations of the motor system 10, the electric drive system 100, the abnormality diagnosis system 130, the integrated control unit 120, the electric integral ECU 110, and the like according to the embodiments are merely examples. Various modifications are possible. For example, the abnormality diagnosis system 130 is not limited to the electric aircraft 20 and may be mounted in an arbitrary moving body such as an electric vehicle, such as an automobile or a train, or a ship. In addition, the integrated control unit 120 may not be mounted in the electric aircraft 20 and, for example, may be configured by a server apparatus that is set in a control tower on the ground or the like. In this configuration, the motor systems 10 and the abnormality diagnosis system 130 may be controlled by communication through the communication unit 60.

(F7) The motor control unit 122, the integrated control unit 120, the abnormality diagnosis system 130, and the methods thereof described in the present disclosure may be actualized by a dedicated computer that is provided so as to be configured by a processor and a memory, the processor being programmed to provide one or a plurality of functions that are realized by a computer program. Alternatively, the motor control unit 122, the integrated control unit 120, the abnormality diagnosis system 130, and the methods thereof described in the present disclosure may be actualized by a dedicated computer that is provided by a processor being configured by a single dedicated hardware logic circuit or more.

As another alternative, the motor control unit 122, the integrated control unit 120, the abnormality diagnosis system 130, and the methods thereof described in the present disclosure may be actualized by a single dedicated computer or more. The dedicated computer may be configured by a combination of a processor that is programmed to provide one or a plurality of functions, a memory, and a processor that is configured by a single hardware logic circuit or more. In addition, the computer program may be stored in a non-transitory computer-readable storage medium that can be read by a computer as instructions performed by the computer.

The present disclosure is not limited to the above-described embodiments and can be actualized through various configurations without departing from the spirit of the disclosure. For example, technical features according to embodiments that correspond to technical features in each aspect described in the summary of the invention may be replaced and combined as appropriate to solve some or all of the above-described issued or to achieve some or all of the above-described effects. Furthermore, the technical features may be omitted as appropriate unless described as a requisite in the present specification.

What is claimed is:

1. An abnormality diagnosis system for performing an abnormality diagnosis of a plurality of motor systems that include a motor for moving a moving body, the abnormality diagnosis system comprising:
    a comparison target identifying unit that identifies a comparison target system that is a first motor system, among the plurality of motor systems, that is a comparison target in relation to a diagnosis target system that is a second motor system, among the plurality of motor systems, that is a target of the abnormality diagnosis;
    a state-related value acquiring unit that acquires a state-related value that is a value that is related to an operation state of the motor from each of the diagnosis target system and the comparison target system; and
    a diagnosing unit that performs a comparison of the state-related value that is acquired from the diagnosis target system and the state-related value that is acquired from the comparison target system, and diagnoses a presence or absence of an abnormality in the diagnosis target system using a result of the comparison.

2. The abnormality diagnosis system according to claim 1, wherein:
    the diagnosing unit
        determines a first difference by comparing the state-related value that is acquired from the diagnosis target system and the state-related value that is acquired from the comparison target system, and
        diagnoses that an abnormality has occurred in the diagnosis target system when the first difference is greater than a first threshold.

3. The abnormality diagnosis system according to claim 2, wherein:
    the diagnosing unit diagnoses that an abnormality has occurred in both of the diagnosis target system and the comparison target system in response to the first difference being greater than the first threshold.

4. The abnormality diagnosis system according to claim 1, wherein:
    the plurality of motor systems are each controlled based on a target control value that is transmitted from an integrated control unit that controls the plurality of motor systems; and
    the comparison target identifying unit
        acquires the target control value that is transmitted to each motor system,
        determines a second difference by comparing the target control value that is transmitted to the diagnosis target system and the target control value that is transmitted to another motor system, and
        in response to the second difference being continuously equal to or less than a second threshold during a threshold period or longer, identifies the motor system that corresponds to the second difference as the comparison target system.

5. The abnormality diagnosis system according to claim 2, wherein:
    the plurality of motor systems are each controlled based on a target control value that is transmitted from an integrated control unit that controls the plurality of motor systems; and
    the comparison target identifying unit acquires the target control value that is transmitted to each motor system, determines a second difference by comparing the target control value that is transmitted to the diagnosis target system and the target control value that is transmitted to another motor system, and in response to the second difference being continuously equal to or less than a second threshold during a threshold period or longer, identifies the motor system that corresponds to the second difference as the comparison target system.

6. The abnormality diagnosis system according to claim 3, wherein:

the plurality of motor systems are each controlled based on a target control value that is transmitted from an integrated control unit that controls the plurality of motor systems; and the comparison target identifying unit
acquires the target control value that is transmitted to each motor system, determines a second difference by comparing the target control value that is transmitted to the diagnosis target system and the target control value that is transmitted to another motor system, and in response to the second difference being continuously equal to or less than a second threshold during a threshold period or longer, identifies the motor system that corresponds to the second difference as the comparison target system.

7. The abnormality diagnosis system according to claim 2, wherein:

the moving body is an electric aircraft that has a plurality of rotors;

the plurality of motor systems respectively rotatably drive the plurality of rotors using the motor; and the first threshold when the rotor that is rotatably driven by the comparison target system is a symmetrically positioned rotor is smaller compared to the first threshold when the rotor that is rotatably driven by the comparison target system is not the symmetrically positioned rotor, the symmetrically positioned rotor being the rotor that is in a position that is point-symmetrical to the rotor that is rotatably driven by the diagnosis target system with a gravitational center position of the electric aircraft as a center when viewed in a vertical direction, or the rotor that is linearly symmetrical to the rotor that is rotatably driven by the diagnosis target system with an axial line of the electric aircraft that passes through the gravitational center position as a center when viewed in the vertical direction.

8. The abnormality diagnosis system according to claim 3, wherein:

the moving body is an electric aircraft that has a plurality of rotors;

the plurality of motor systems respectively rotatably drive the plurality of rotors using the motor; and the first threshold when the rotor that is rotatably driven by the comparison target system is a symmetrically positioned rotor is smaller compared to the first threshold when the rotor that is rotatably driven by the comparison target system is not the symmetrically positioned rotor, the symmetrically positioned rotor being the rotor that is in a position that is point-symmetrical to the rotor that is rotatably driven by the diagnosis target system with a gravitational center position of the electric aircraft as a center when viewed in a vertical direction, or the rotor that is linearly symmetrical to the rotor that is rotatably driven by the diagnosis target system with an axial line of the electric aircraft that passes through the gravitational center position as a center when viewed in the vertical direction.

9. The abnormality diagnosis system according to claim 2, wherein:

the plurality of motor systems include a high-reliability system and a low-reliability system that has a lower reliability than the high-reliability system; and the diagnosing unit diagnoses that an abnormality has occurred in the diagnosis target system in response to, in the comparison, the first difference being greater than the first threshold when the comparison target system is the high-reliability system and the diagnosis target system is the low-reliability system.

10. The abnormality diagnosis system according to claim 3, wherein:

the plurality of motor systems include a high-reliability system and a low-reliability system that has a lower reliability than the high-reliability system; and the diagnosing unit diagnoses that an abnormality has occurred in the diagnosis target system in response to, in the comparison, the first difference being greater than the first threshold when the comparison target system is the high-reliability system and the diagnosis target system is the low-reliability system.

11. The abnormality diagnosis system according to claim 9, wherein:

the diagnosing unit diagnoses that an abnormality has occurred in both of the comparison target system and the diagnosis target system in response to, in the comparison, the first difference being greater than the first threshold when the comparison target system and the diagnosis target system have in common being either of the high-reliability system and the low-reliability system.

12. The abnormality diagnosis system according to claim 10, wherein:

the diagnosing unit diagnoses that an abnormality has occurred in both of the comparison target system and the diagnosis target system in response to, in the comparison, the first difference being greater than the first threshold when the comparison target system and the diagnosis target system have in common being either of the high-reliability system and the low-reliability system.

13. The abnormality diagnosis system according to claim 1, wherein:

the motor system includes the motor and an inverter circuit that controls the motor; and the state-related value includes at least one of a voltage value that is supplied to the inverter circuit from a power supply and a temperature value of the motor system.

14. The abnormality diagnosis system according to claim 2, wherein:

the motor system includes the motor and an inverter circuit that controls the motor; and the state-related value includes at least one of a voltage value that is supplied to the inverter circuit from a power supply and a temperature value of the motor system.

15. The abnormality diagnosis system according to claim 3, wherein:

the motor system includes the motor and an inverter circuit that controls the motor; and the state-related value includes at least one of a voltage value that is supplied to the inverter circuit from a power supply and a temperature value of the motor system.

16. The abnormality diagnosis system according to claim 4, wherein:

the motor system includes the motor and an inverter circuit that controls the motor; and the state-related value includes at least one of a voltage value that is supplied to the inverter circuit from a power supply and a temperature value of the motor system.

17. The abnormality diagnosis system according to claim 7, wherein:

the motor system includes the motor and an inverter circuit that controls the motor; and the state-related value includes at least one of a voltage value that is supplied to the inverter circuit from a power supply and a temperature value of the motor system.

18. The abnormality diagnosis system according to claim 9, wherein:

the motor system includes the motor and an inverter circuit that controls the motor; and the state-related value includes at least one of a voltage value that is supplied to the inverter circuit from a power supply and a temperature value of the motor system.

19. The abnormality diagnosis system according to claim 11, wherein:

the motor system includes the motor and an inverter circuit that controls the motor; and the state-related value includes at least one of a voltage value that is supplied to the inverter circuit from a power supply and a temperature value of the motor system.

20. An abnormality diagnosis method for performing an abnormality diagnosis of a plurality of motor systems that include a motor for moving a moving body, the abnormality diagnosis method comprising:

identifying a comparison target system that is a first motor system, among the plurality of motor systems, that is a comparison target in relation to a diagnosis target system that is a second motor system, among the plurality of motor systems, that is a target of the abnormality diagnosis;

acquiring a state-related value that is a value that is related to an operation state of the motor from each of the diagnosis target system and the comparison target system; and performing a comparison of the state-related value that is acquired from the diagnosis target system and the state-related value that is acquired from the comparison target system, and diagnosing a presence or absence of an abnormality in the diagnosis target system using a result of the comparison.

* * * * *